(12) United States Patent
Lim

(10) Patent No.: US 8,194,430 B2
(45) Date of Patent: Jun. 5, 2012

(54) INFORMATION STORAGE DEVICES USING MOVEMENT OF MAGNETIC DOMAIN WALL AND METHODS OF MANUFACTURING THE INFORMATION STORAGE DEVICE

(75) Inventor: Chee-kheng Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 73 days.

(21) Appl. No.: 11/980,425

(22) Filed: Oct. 31, 2007

(65) Prior Publication Data
US 2008/0152953 A1 Jun. 26, 2008

(30) Foreign Application Priority Data
Dec. 22, 2006 (KR) .................. 10-2006-0133096

(51) Int. Cl.
*G11B 5/66* (2006.01)
(52) U.S. Cl. ........... 365/87; 365/171; 428/827; 428/836
(58) Field of Classification Search .................. None
See application file for complete search history.

(56) References Cited

U.S. PATENT DOCUMENTS

| | | |
|---|---|---|
| 5,815,342 A | 9/1998 | Akiyama et al. |
| 5,870,328 A | 2/1999 | Mohri |
| 6,482,742 B1 | 11/2002 | Chou |
| 6,566,872 B1 | 5/2003 | Sugitani |
| 6,713,195 B2 | 3/2004 | Wang et al. |
| 6,834,005 B1 | 12/2004 | Parkin |
| 6,864,042 B1 | 3/2005 | Kuo et al. |
| 6,898,132 B2 | 5/2005 | Parkin |
| 6,920,062 B2* | 7/2005 | Parkin .......................... 365/158 |
| 7,031,178 B2 | 4/2006 | Parkin |
| 7,236,386 B2 | 6/2007 | Parkin |
| 7,586,781 B2 | 9/2009 | Saitoh et al. |
| 2004/0134565 A1* | 7/2004 | Sun et al. ..................... 148/105 |
| 2004/0251232 A1 | 12/2004 | Chen et al. |
| 2004/0252538 A1 | 12/2004 | Parkin |
| 2004/0252539 A1 | 12/2004 | Parkin |
| 2005/0041463 A1 | 2/2005 | Drewes |

(Continued)

FOREIGN PATENT DOCUMENTS

GB 1 497 653 1/1978
(Continued)

OTHER PUBLICATIONS

Holleitner et al., "Pinning a domain wall in (Ga, Mn)As with focused ion beam lithography," Appl. Phys. Lett., vol. 85, No. 23, Dec. 2004, pp. 5622-5624.*

(Continued)

*Primary Examiner* — Holly Rickman
(74) *Attorney, Agent, or Firm* — Harness, Dickey & Pierce, P.L.C.

(57) ABSTRACT

An information storage device includes a magnetic layer and a supply unit. The magnetic layer includes a plurality of regions, a first region having a first magnetic anisotropic energy and a second region having a second magnetic anisotropic energy. The first and second regions are arranged alternately, and the second region is doped with impurity ions. The second magnetic anisotropic energy is less than the first magnetic anisotropic energy. The supply unit applies energy to the magnetic layer for moving magnetic domain walls within the magnetic layer.

23 Claims, 6 Drawing Sheets

U.S. PATENT DOCUMENTS

| | | | |
|---|---|---|---|
| 2005/0078509 A1 | 4/2005 | Parkin | |
| 2005/0078511 A1 | 4/2005 | Parkin | |
| 2005/0100830 A1 | 5/2005 | Xu et al. | |
| 2005/0174876 A1 | 8/2005 | Katoh | |
| 2005/0220990 A1* | 10/2005 | Aoyama et al. | 427/127 |
| 2006/0024529 A1 | 2/2006 | Murakami | |
| 2006/0104110 A1 | 5/2006 | Sun et al. | |
| 2006/0120132 A1 | 6/2006 | Parkin | |
| 2006/0237808 A1 | 10/2006 | Saito | |
| 2007/0254188 A1 | 11/2007 | Hayakawa et al. | |
| 2008/0075978 A1* | 3/2008 | Weller et al. | 428/826 |
| 2008/0130355 A1 | 6/2008 | Saitoh et al. | |

FOREIGN PATENT DOCUMENTS

| | | |
|---|---|---|
| JP | 5-267726 | 10/1993 |
| WO | WO 2004/077451 | 9/2004 |

OTHER PUBLICATIONS

European Search Report (dated Feb. 26, 2008) for counterpart European Patent Application No. 07123052.8-1233 is provided for the purposes of certification under 37 C.F.R. §§ 1.97(e) and 1.704(d).

Fassbender, J. et al., "Magnetic patterning by means of ion irradiation and implantation," Journal of Magnetism and Magnetic Materials, Elsevier Science Publishers, Amsterdam, NL, vol. 320, No. 3-4, Oct. 25, 2007, pp. 579-596.

Fassbender, J., et al., "Topical Review; Tailoring magnetism by light-ion irradiation; Topical Review" Journal of Physics D. Applied Physics, Institute of Physics Publishing, Bristol, GB, vol. 37, No. 16, Aug. 21, 2004, pp. R179-R196.

Owen, N. et al., "Patterning Magnetic Antidot-Type Arrays by Ga.+Implantation," IEEE Transactions on Magnetics, IEEE Service Center, New York, NY, vol. 38, No. 5, Sep. 2002, pp. 2553-2555.

Terris, B., et al., "Topical Review; Nanofabricated and self-assembled magnetic structures as data storage media; Topical Review" Journal of Physics D. Applied Physics, Institute of Physics Publishing, Bristol, GB, vol. 38, No. 12, Jun. 21, 2005, pp. R199-R222.

Chinese Office Action dated Nov. 27, 2009 and English translation thereof.

Chinese Office Action dated Sep. 8, 2010 and English translation thereof.

U.S. Office Action for U.S. Appl. No. 11/980,353 dated Apr. 14, 2010.

Notice of Allowance for U.S. Appl. No. 11/980,353 dated Oct. 15, 2010.

U.S. Office Action for U.S. Appl. No. 11/980,553 dated Aug. 3, 2010.

U.S. Office Action for U.S. Appl. No. 11/980,455 dated Jun. 24, 2010.

Notice of Allowance for U.S. Appl. No. 11/980,627 dated Aug. 19, 2010.

Notice of Allowance dated Jan. 25, 2011, issued in U.S. Appl. No. 11/980,455.

Notice of Allowance dated Jan. 25, 2011, issued in U.S. Appl. No. 11/980,353.

Final Office Action dated Feb. 2, 2011, issued in U.S. Appl. No. 11/980,553.

Second Office Action by the Chinese Patent Office dated Jun. 2, 2011 for Chinese Application No. 200710159774.9 with English translation.

\* cited by examiner

INFORMATION STORAGE DEVICES USING MOVEMENT OF MAGNETIC DOMAIN WALL AND METHODS OF MANUFACTURING THE INFORMATION STORAGE DEVICE

PRIORITY STATEMENT

This non-provisional patent application claims priority under 35 U.S.C. §119 to Korean Patent Application No. 10-2006-0133096, filed on Dec. 22, 2006 in the Korean Intellectual Property Office, the entire contents of which is incorporated herein by reference.

BACKGROUND

Description of the Related Art

A conventional hard disk drive (HDD) is a device that reads and writes information by rotating a magnetic recording medium and moving a reading/writing head above the magnetic recording medium. The magnetic recording medium may be in disk form. Conventional HDDs are non-volatile data storage devices capable of storing 100 gigabytes (GB) of data, and may be used as a main storage device in computers.

A conventional HDD may include a relatively large amount of moving mechanical parts or systems. These mechanical systems may cause various mechanical faults, for example, when the HDD is moved and/or affected by a shock, thereby decreasing mobility and/or reliability. Also, these mechanical systems may increase the manufacturing complexity, costs and/or power consumption and may generate undesirable noise. For example, when size of conventional HDDs is reduced, manufacturing complexity and/or costs may increase.

A data or information storage device using magnetic domain wall movement may be an alternative to conventional HDDs. Within conventional data storage devices using magnetic domain wall movement, magnetic minute regions constituting a magnetic body are referred to as magnetic domains. In a magnetic domain, the direction of the magnetic moment is pinned or constant (e.g., always the same). The size and the magnetization direction of the magnetic domains may be controlled by property, shape, size of the magnetic material and/or external energy. A magnetic domain wall is a boundary between magnetic domains having different magnetization directions. Magnetic domain walls may be moved by a current or a magnetic field applied to the magnetic material.

By applying principles of the magnetic domain wall movement to conventional information storage devices, magnetic domains may be passed through pinned reading/writing heads by moving the magnetic domain wall, thereby enabling reading/writing without rotation of a recording medium. Thus, conventional information storage devices using magnetic domain wall movement may store a relatively large amounts of data without moving mechanical systems required by conventional HDDs. However, in conventional information storage devices using magnetic domain wall movement, magnetic domain walls may be relatively unstable while moving. To improve stability of the movement of the magnetic domain wall bit by bit, notches may be formed at a side of the magnetic layer. The magnetic domain walls that begin to move in response to a current pulse at a critical value or greater may be stopped at the notches. Thus, the magnetic domain wall may be moved by one bit by a plurality of notches formed uniformly at the magnetic layer. Also, because the magnetic domain wall is pinned more stably by the notches, data stored in the magnetic layers may be preserved for a longer period of time.

However, forming fine-sized notches at a side of the magnetic layer having a width of about several tens of nanometers may be relatively difficult. Due to the relatively high density of the information storage device, the width of the magnetic layer may be reduced to several tens of nanometers or less. As a result, the size of the notches may need to be reduced as well.

For example, when notches are formed at each side of the magnetic layer having a width of about 50 nm, notches may be formed to have a width of about 15 nm, which is about one third of the width of the magnetic layer. However, forming such notches may be relatively difficult using conventional exposure and/or etching techniques. Moreover, forming notches to have relatively uniform interval, size and/or shape may be relatively difficult. If the interval, size and/or shape of the notches are not sufficiently uniform, the intensity of the magnetic field stopping the magnetic domain wall (e.g., the intensity of the pinning magnetic field) may vary, and thus, the reliability of the information storage device may decrease.

SUMMARY

Example embodiments relate to information storage devices, for example, an information storage device using movement of magnetic domain walls and methods of manufacturing the same.

At least one example embodiment provides an information storage device. According to at least this example embodiment, a magnetic layer may include a plurality of magnetic domains. A supply unit or circuit may supply energy to the magnetic layer for moving magnetic domain walls. The magnetic layer may further include at least a first region having a first magnetic anisotropic energy and at least a second region having a second magnetic anisotropic energy. The first magnetic anisotropic energy may be greater than the second anisotropic energy. The first and second regions may be alternately arranged, and the second regions may be doped with impurity ions.

According to at least some example embodiments, the impurity ions may include at least one of He$^+$, Ga$^+$ or the like. A plurality of second regions may be formed at equal or substantially equal intervals. The interval between the second regions may be about 5 to about 1000 nm, inclusive. The width of the second region may be about 2 to about 250 nm, inclusive. The first region may have magnetic anisotropic energy density of about $2\times10^3$ to about $10^7$ J/m$^3$, inclusive. The second region may have magnetic anisotropic energy density of about 10 to about $10^3$ J/m$^3$, inclusive. The magnetic layer may be formed of a material including at least one of Fe, Co, Pt, an alloy thereof or the like. The magnetic layer may be formed of at least one selected from the group including or consisting of FePt, FePd, CoCr, CoCu, CoPt, CoTb, CoCrPt, CoFeTb, CoFeGd, CoFeNi or the like.

At least one example embodiment provides a method of manufacturing an information storage device. According to at least this example embodiment, a resin layer may be formed to cover a magnetic layer. A plurality of grooves exposing the magnetic layer may be formed in the resin layer, and the exposed magnetic layer may be doped with impurity ions.

According to at least some example embodiments, a first portion of the magnetic layer doped with the impurity ions may have smaller magnetic anisotropic energy than a second portion of the magnetic layer. The grooves may be formed using a nano-imprinting method. The forming of the grooves in the resin layer may include stamping the resin layer using a master stamp having a plurality of downward-oriented protruding portions, and removing the master stamp. The impurity ions may include at least one of He$^+$, Ga$^+$ or the like. The grooves may be formed at equal or substantially equal intervals. The intervals between the grooves may be about 5 to about 1000 nm, inclusive. The width of the grooves may be about 2 to about 250 nm, inclusive. The magnetic layer may be formed of a material including at least one of Fe, Co, Pt, an alloy thereof or the like. The magnetic layer may be formed of at least one selected from the group consisting of FePt, FePd, CoCr, CoCu, CoPt, CoTb, CoCrPt, CoFeTb, CoFeGd, CoFeNi or the like.

BRIEF DESCRIPTION OF THE DRAWINGS

Example embodiments will become more apparent by describing in detail the attached drawings in which.

DETAILED DESCRIPTION OF EXAMPLE EMBODIMENTS

Figure 1:
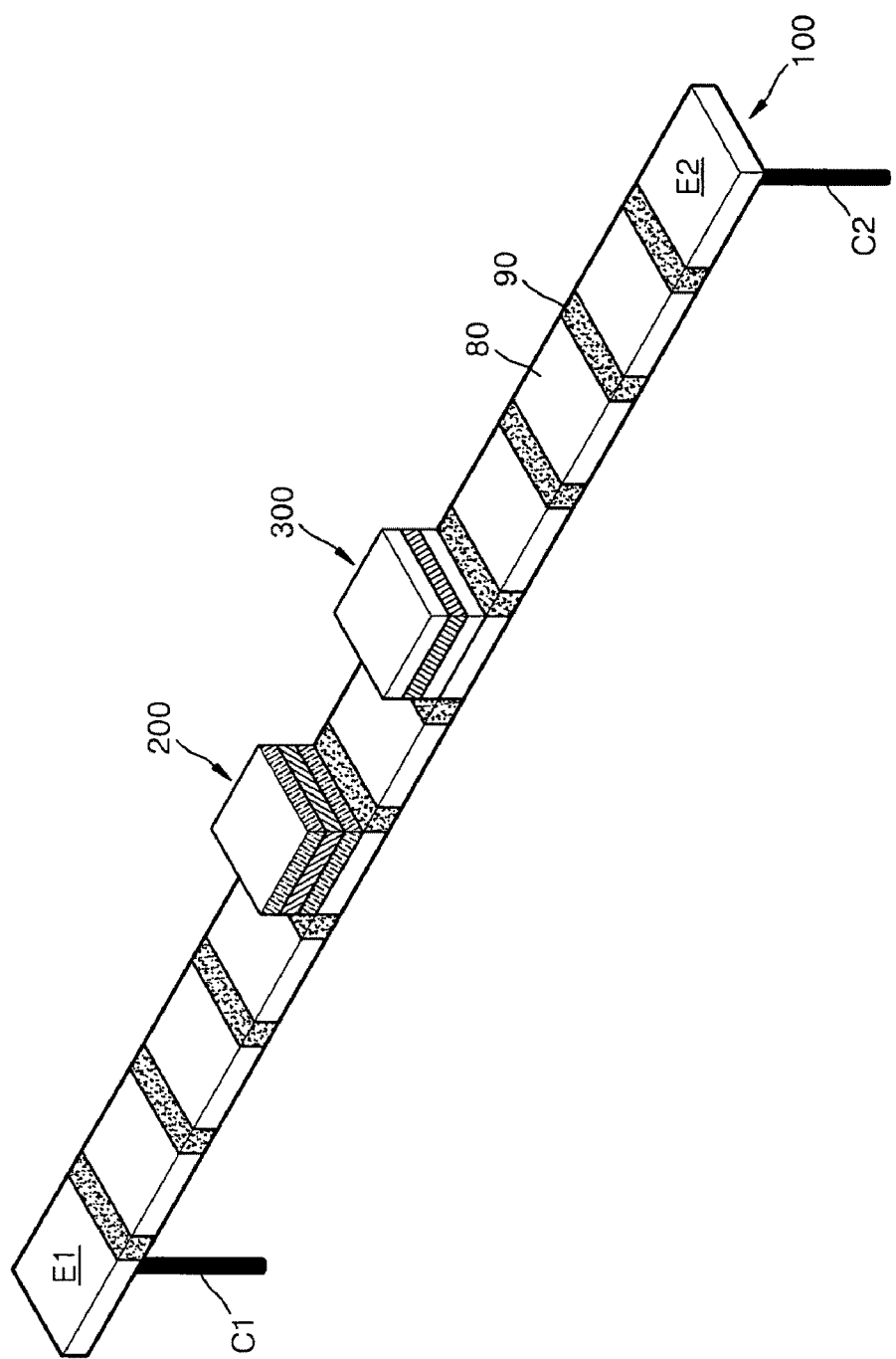
FIG. 1 is a perspective view of an information storage device according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a perspective view of an information storage device using movement of magnetic walls according to an example embodiment.

Referring to FIG. 1, an example embodiment of an information storage device may include a magnetic layer 100 formed on a substrate (not shown). The magnetic layer 100 may include a plurality of magnetic domains. The magnetic layer 100 may be a storage track or information storing layer in which data may be stored.

The magnetic layer 100 may include at least one first and second region 80 and 90. For example, the magnetic layer 100 may include a plurality of first and second regions 80 and 90 arranged alternately. The first region 80 may be a ferromagnetic region having magnetic anisotropic energy density of about $2 \times 10^3$ to about $10^7$ J/m$^3$, inclusive. The second region 90 may be a soft magnetic region having a magnetic anisotropic energy density of about $10^1$ to about $10^3$ J/m$^3$, inclusive. The magnetic layer 100 may be formed of a material including at least one of Fe, Co, Pt, an alloy thereof or the like, for example, one of FePt, FePd, CoCr, CoCu, CoPt, CoTb, CoCrPt, CoFeTb, CoFeGd, and CoFeNi. The second region 90 may be selectively doped with impurity ions. The impurity ions may include He$^+$, Ga$^+$, a combination thereof or the like. When the second region 90 is doped with impurity ions, the magnetic coupling effect between magnetic particles forming the magnetic layer 100 may be reduced, thereby reducing the magnetic anisotropic energy of the second region 90. The second region 90 may also be referred to as a soft magnetic region.

In the second region 90, the spin exchange energy of the magnetic domain walls may be smaller than that of the first region 80 (also referred to as the ferromagnetic region). Thus, the magnetic domain walls may have a more stable energy state in the second region 90 than in the first region 80. Accordingly, the magnetic domain walls that begin to move in the magnetic layer 100 may be pinned in the second region 90.

First and second conductive lines or wires C1 and C2 may be respectively connected to a first end E1 and a second end E2 of the magnetic layer 100. The first and second conductive lines C1 and C2 may be connected to a driving device (not shown) such as a transistor or a diode, for example. Energy (e.g., current) for moving the magnetic domain walls of the magnetic layer 100 may be applied through the first and second conductive lines C1 and C2. The moving direction of the magnetic domain walls may be determined according to the direction of the current. Because the magnetic domain walls move in the direction of electrons, the direction of the magnetic domain walls may be opposite to the direction of the current.

A writer 200 for writing data and a reader 300 for reading data recorded to the magnetic layer 100 may be formed in respective regions of the magnetic layer 100. The writer 200 and the reader 300 may tunnel magneto resistance (TMR) heads, a giant magneto resistance (GMR) heads or the like. Though not illustrated, an insulating layer and/or an electrode layer may be included on a lower surface of the magnetic layer 100 on which the writer 200 may be formed. The structure of the writer 200 and the reader 300 may be modified in various ways without being limited by the structure of the TMR or GMR head. For example, the writer 200 may be a writing track attached to a side of the first end E1 of the magnetic layer 100 and having first and second magnetic domains magnetized in opposite directions. When the first or second magnetic domains extend to a bonding portion of the magnetic layer 100 in the writing track, and a current is applied to the writing track from the magnetic layer 100, data corresponding to the first or second magnetic domain may be recorded in the first end E1.

By moving the magnetic domain walls bit by bit by applying a current to the magnetic layer 100 through the first and second conductive lines C1 and C2, data may be recorded in the magnetic layer 100 by applying a writing current to the writer 200. Similarly, by moving the magnetic domain walls by applying a current to the magnetic layer 100 through the first and second conductive lines C1 and C2, data stored to the magnetic layer 100 may be reproduced by applying a reading current to the reader 300.

In information storage devices according to example embodiments, the second region 90 may be a pinning region, and thus, the magnetic domain walls may be moved bit by bit, and data recorded to the magnetic layer 100 may be preserved more stably.

FIGS. 2A through 2I are cross-sectional views for illustrating a method of forming a magnetic layer included in an information storage device according to an example embodiment. FIGS. 2A through 2E show a method of forming a master stamp, and FIGS. 2F through 2I show a method of forming a magnetic layer 100 using the master stamp.

Figure 2A:
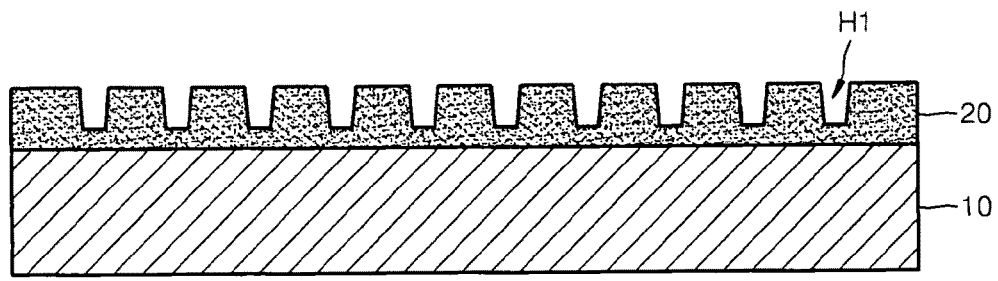
FIGS. 2A through 2I are cross-sectional views for illustrating a method of forming a magnetic layer included in an information storage device according to an example embodiment.

Referring to FIG. 2A, a molding plate 10 may be coated with a photosensitive layer. The photosensitive layer may be patterned using a given method, for example, E-beam lithography or the like, to form a patterned photosensitive layer 20.

A plurality of first grooves H1 may be formed in the patterned photosensitive layer 20, and lateral side walls of the first grooves H1 may be inclined. For example, the lateral side walls of the first grooves H1 may be at an angle other 90 degrees with the top surface of the molding plate 10. Alternatively, the lateral side walls of the first grooves H1 may be perpendicular to the surface of the molding plate 10.

Figure 2B:
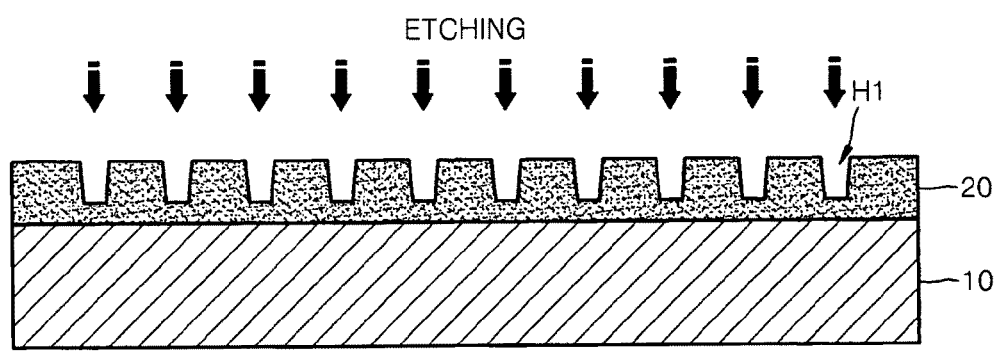

Referring to FIG. 2B, the entire surface of the patterned photosensitive layer 20 and the molding plate 10 may be etched. The molding plate 10 below the patterned photosensitive layer 20 having a relatively small thickness may be etched relatively deeply.

Figure 2C:
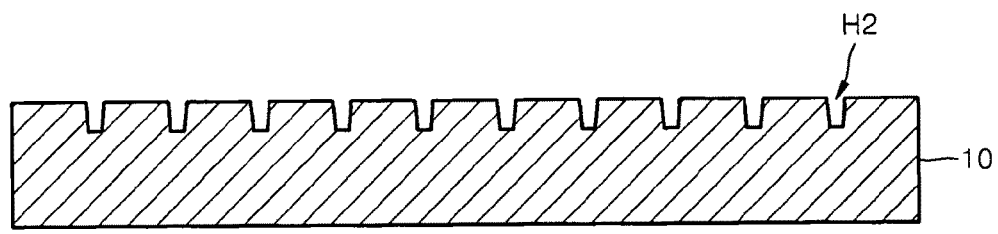

FIG. 2C shows a surface etched molding plate 10. Referring to FIG. 2C, the patterned photosensitive layer 20 may be removed by the surface etching, and nano-sized second grooves H2 may be formed in the molding plate 10. The width of the second grooves H2 may be decreased in a downward direction because the molding plate 10 may be etched at an inclined angle during the surface etching. The inclination angle of the second grooves H2 may be controlled by the etching condition. For example, the depth of the second grooves H2 may be less than the depth of the first grooves H1. The lateral side walls of the second grooves H2 may be at an angle other 90 degrees with the surface of the molding plate 10. Alternatively, the lateral side walls of the second grooves H2 may be perpendicular to the surface of the molding plate 10.

Figure 2D:
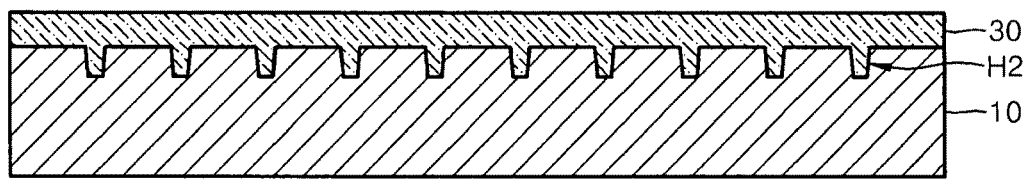

Referring to FIG. 2D, a stamp layer 30 may be formed on the molding plate 20 to fill the second grooves H2 and cover the molding plate 10.

Figure 2E:

As shown in FIG. 2E, the stamp layer 30 may be separated from the molding plate 10. The separated stamp layer 30 will be referred to as a master stamp 30 hereinafter.

Figure 2F:
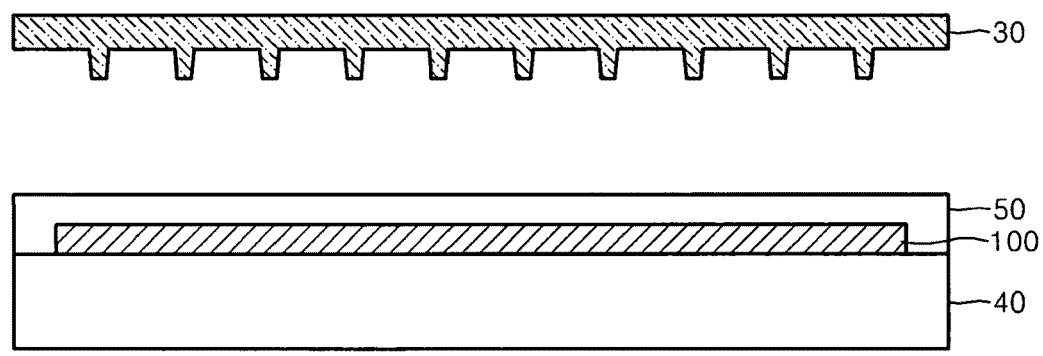

Referring to FIG. 2F, a magnetic layer 100 may be formed on a substrate 40. A resin layer 50 may be formed on the magnetic layer 100 and an exposed portion of the substrate 40. The resin layer 50 may to cover the top and side walls of the magnetic layer 100. The master stamp 30 manufactured according to the method illustrated in FIGS. 2A through 2E may be arranged above the resin layer 50.

Figure 2G:
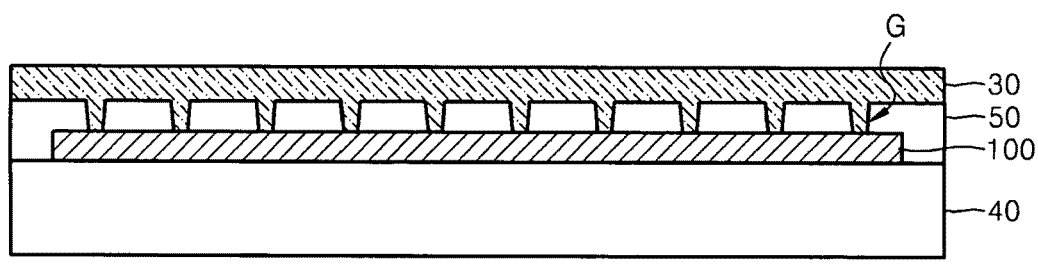

Referring to FIG. 2G, the resin layer 50 may be patterned at a nano scale by imprinting the resin layer 50 using the master stamp 30. As a result, a plurality of grooves G may be formed in the resin layer 50.

Figure 2H:
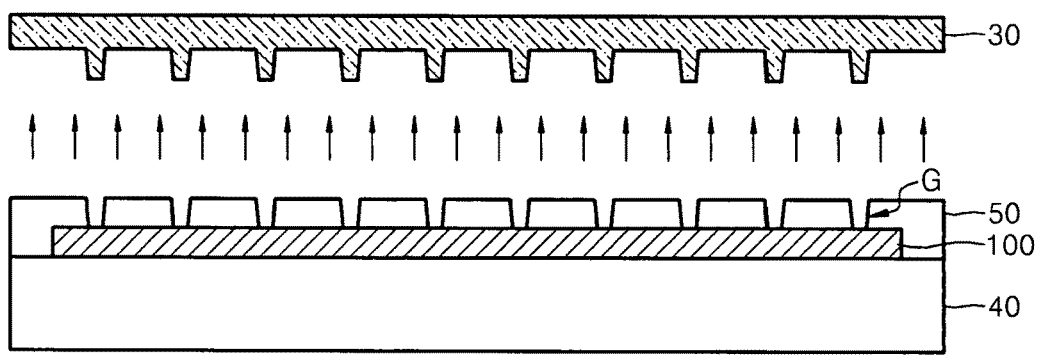

Referring to FIG. 2H, the master stamp 30 may be separated from the resin layer 50. When the master stamp 30 is separated from the resin layer 50, at least some portions of the resin layer 50 may remain on a lower surface of the grooves G. The resin layer 50 remaining on the lower surface of the grooves G may be removed using, for example, a plasma ashing method or the like. The master stamp 30 may be used several times. The above nano-imprinting process may be more simple and/or economic, and thus, appropriate for mass production.

Figure 2I:
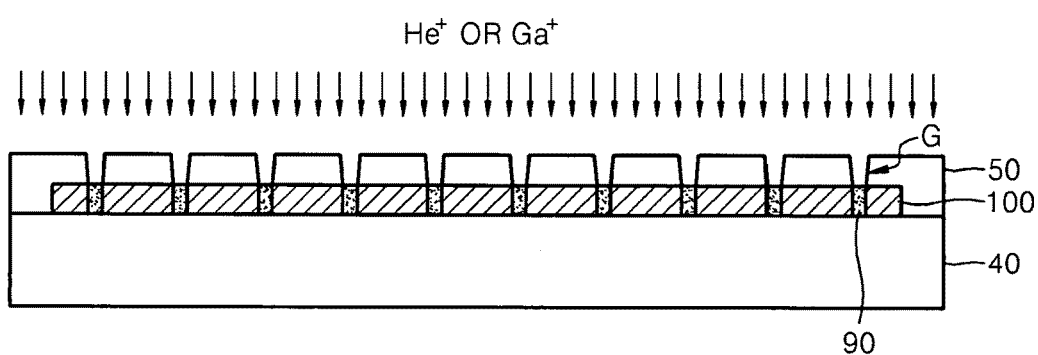

Referring to FIG. 2I, portions of the magnetic layer 100 may be exposed by the grooves G. The exposed magnetic layer 100 may be doped with impurity ions such as $He^+$, $Ga^+$ a combination thereof or the like using the resin layer 50 as an ion implantation mask. Thus, doped regions 90 may be formed in the magnetic layer 100. The doped regions 90 may be the same or substantially the same as the second regions 90 described with reference to FIG. 1. The remaining regions in the magnetic layer 100 may be the same or substantially the same as the first regions 80 described with reference to FIG. 1.

After removing the resin layer 50, though not illustrated, a writer and a reader may be formed in a region of the magnetic layer 100. Thus, an information storage device including the magnetic layer 100 including the doped regions 90 may be manufactured.

According to example embodiments, a magnetic layer 100 may not be modified geometrically, but pinning regions may be formed by modifying properties of portions of the magnetic layer 100 using methods of ion implantation. Thus, more minute pinning regions may be formed more uniformly in the magnetic layer 100. According to example embodiments, the recording density and/or reliability of information storage devices may improve.

Grooves G may also be formed using methods other than the nano-imprinting method using the master stamp 30. For example, instead of imprinting the resin layer 50 using the master stamp 30, the grooves G may be formed by etching using E-beam lithography, lithography using interference of ultraviolet rays or laser, nano sphere lithography using nano particles or the like.

Figure 3:
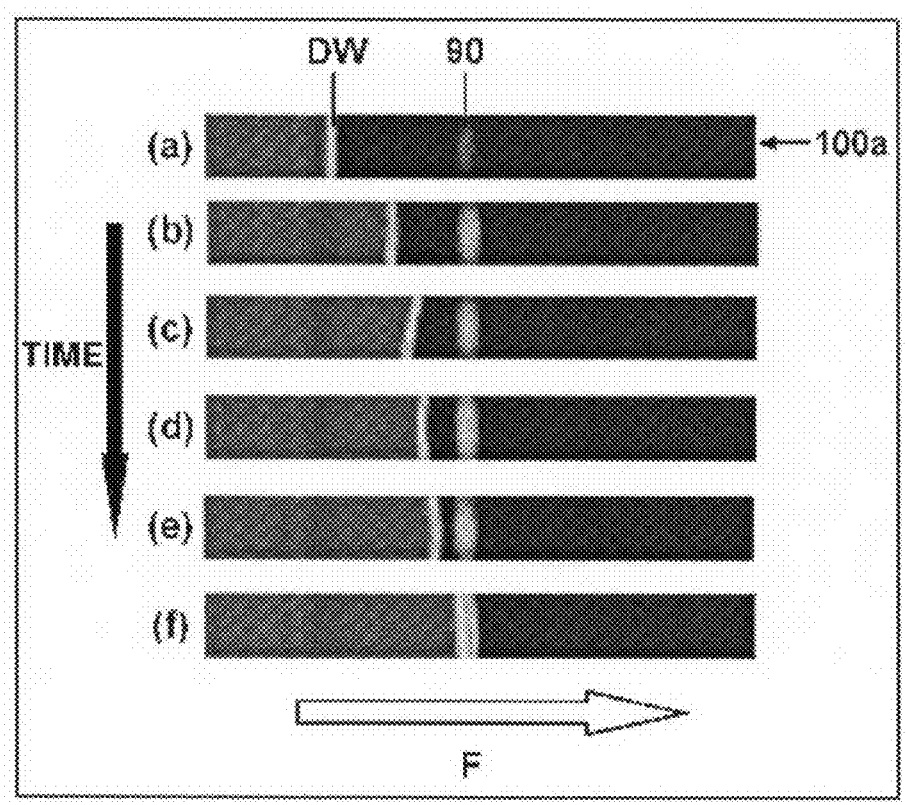
FIG. 3 shows simulation results of changes in the position of a magnetic domain wall with time when moving the magnetic domain wall by applying an external magnetic field to a sample magnetic layer formed in accordance with a method according to an example embodiment.

FIG. 3 shows simulation results of changes in the position of a magnetic domain wall DW with time when moving a magnetic domain wall DW of a sample magnetic layer 100a by applying an external magnetic field to the sample magnetic layer 100a formed in accordance with a method described herein. The sample magnetic layer 100a may include two magnetic domains magnetized in opposite directions to each other in the form of a bar. The magnetic layer 100a may also include a magnetic domain wall DW formed between the magnetic domains. The width, length and thickness of the sample magnetic layer 100a may be about 50 nm, about 430 nm and about 10 nm, respectively. A doped region 90 may be formed in the center of the sample magnetic layer 100a. The doped region 90 may be the same or substantially the same as the second region 90 described above with regard to FIG. 1. The magnetic domain wall DW may be disposed to the left of the doped region 90 and may be moved by an external magnetic field F applied in a direction to the right toward the doped region 90. In FIG. 3, (a) through (f) represent the arrangement of the magnetic domains with respect to time.

Figure 4:
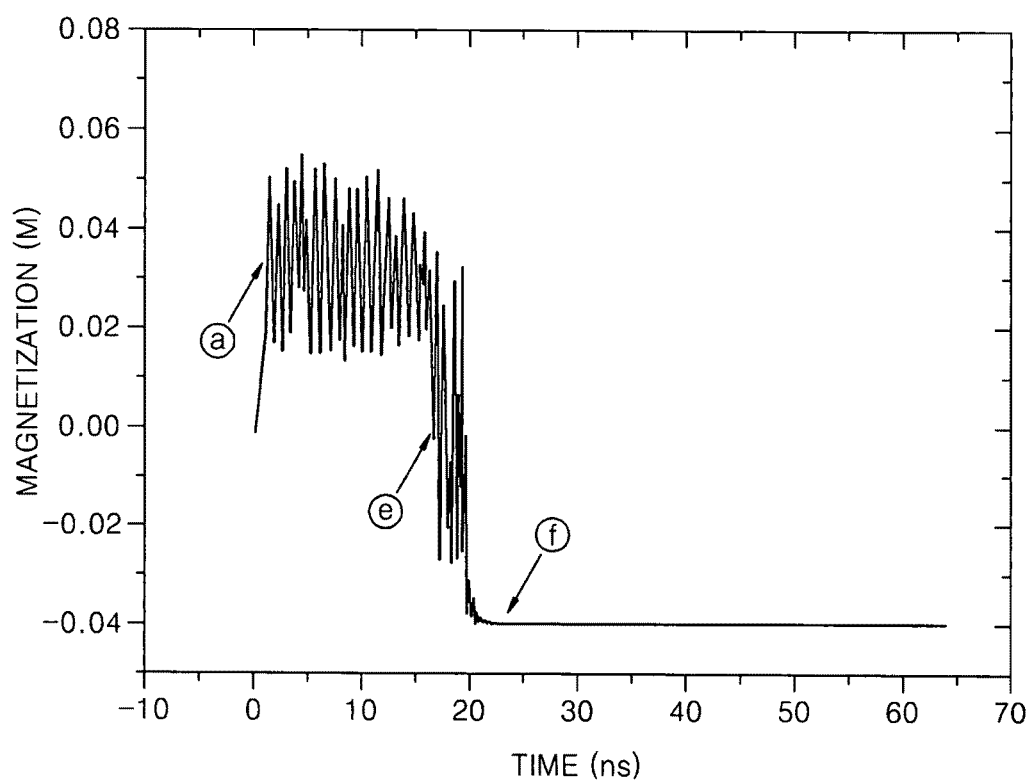
FIG. 4 is a graph showing changes in magnetization of the sample magnetic layer of FIG. 3 with time when moving the magnetic domain wall by applying an external magnetic field thereto.

FIG. 4 is a graph showing changes in the magnetization of the sample magnetic layer 100a with time when moving the magnetic domain wall DW by applying the external magnetic field F to the sample magnetic layer 100a of FIG. 3. In FIG. 4, (a), (e), and (f) correspond to (a), (e), and (f) of FIG. 3, respectively.

Referring to FIGS. 3 and 4, as the magnetic domain wall DW moves toward the doped region 90, the magnetization M may decrease while oscillating, and when the magnetic domain wall DW reaches the doped region 90, the magnetic domain wall DW may stop in the doped region 90. At this point, the magnetization M may be constant or substantially constant, thus indicating that the doped region 90 is the pinning region. The magnetization M may decrease while oscillating because the magnetic domain wall DW may move while oscillating.

As described above, according to example embodiments, more minute, smaller and/or more uniform pinning regions may be formed by changing properties of portions of the magnetic layer 100 by nano-imprinting and/or ion implanting. Thus, according to example embodiments, recording density and/or reliability of information storage devices may be improved.

While example embodiments have been particularly shown and described with reference to the drawings, example embodiments should be considered in descriptive sense only and not for purposes of limitation. For example, it will be understood by those skilled in the art that various changes in form and details of the structure of the magnetic layer 100, and the structure and location of the writer 200 and/or the reader 300 in information storage devices may be made. Therefore, the scope of the present invention is defined not by the detailed description of the invention but by the appended claims.

What is claimed is:

1. A magnetic domain information storage device comprising:
 a magnetic layer including,
  a plurality of magnetic domain storage regions for storing data; and
  a separate magnetic domain wall pinning region directly between boundaries of each pair of adjacent magnetic domain storage regions, each magnetic domain wall pinning region being configured to pin a magnetic domain wall moving within the magnetic layer, the magnetic domain wall being moved in response to a current applied to the magnetic layer; wherein
   each magnetic domain storage region has a first magnetic anisotropic energy and each magnetic domain wall pinning region has a second magnetic anisotropic energy, each magnetic domain wall pinning region being doped with impurity ions, and the first magnetic anisotropic energy being greater than the second magnetic anisotropic energy.

2. The magnetic domain information storage device of claim 1, further including,
 a supply unit configured to supply energy to the magnetic layer for moving magnetic domain walls within the magnetic layer.

3. The magnetic domain information storage device of claim 1, wherein the impurity ions include at least one of $He^+$ and $Ga^+$.

4. The magnetic domain information storage device of claim 1, wherein the magnetic domain wall pinning regions are formed at equal intervals.

5. The magnetic domain information storage device of claim 1, wherein intervals between the magnetic domain wall pinning regions are between 5 and 1000 nm, inclusive.

6. The magnetic domain information storage device of claim 1, wherein a width of the each magnetic domain wall pinning region is between 2 and 250 nm, inclusive.

7. The magnetic domain information storage device of claim 1, wherein each magnetic domain storage region has a magnetic anisotropic energy density of between $2 \times 10^3$ and $10^7$ $J/m^3$, inclusive.

8. The magnetic domain information storage device of claim 1, wherein each magnetic domain wall pinning region has a magnetic anisotropic energy density of between $10^1$ and $10^3$ $J/m^3$, inclusive.

9. The magnetic domain information storage device of claim 1, wherein the magnetic layer is formed of a material including at least one of Fe, Co and Pt.

10. The magnetic domain information storage device of claim 1, wherein the magnetic layer is formed of at least one of FePt, FePd, CoCr, CoCu, CoPt, CoTb, CoCrPt, CoFeTb, CoFeGd and CoFeNi.

11. The magnetic domain information storage device of claim 1, wherein the plurality of magnetic domain storage regions and the magnetic domain wall pinning regions are arranged alternately in the magnetic layer.

12. The magnetic domain information storage device of claim 1, wherein each magnetic domain wall pinning region pins only a magnetic domain wall.

13. A magnetic domain information storage device comprising:
 a magnetic layer including, a plurality of magnetic domain storage regions for storing data; and a separate magnetic domain wall pinning region between boundaries of each pair of adjacent magnetic domain storage regions, each magnetic domain wall pinning region being configured to pin a magnetic domain wall moving within the magnetic layer, the magnetic domain wall being moved in response to a current applied to the magnetic layer; wherein each magnetic domain storage region has a first magnetic anisotropic energy and each magnetic domain wall pinning region has a second magnetic anisotropic energy, each magnetic domain wall pinning region being doped with impurity ions, and the first magnetic anisotropic energy being greater than the second magnetic anisotropic energy, and each magnetic domain wall pinning region pins only a magnetic domain wall.

14. The magnetic domain information storage device of claim 13, further including, a supply unit configured to supply energy to the magnetic layer for moving magnetic domain walls within the magnetic layer.

15. The magnetic domain information storage device of claim 13, wherein the impurity ions include at least one of $He^+$ and $Ga^+$.

16. The magnetic domain information storage device of claim 13, wherein the magnetic domain wall pinning regions are formed at equal intervals.

17. The magnetic domain information storage device of claim 13, wherein intervals between the magnetic domain wall pinning regions are between 5 and 1000 nm, inclusive.

18. The magnetic domain information storage device of claim 13, wherein a width of the each magnetic domain wall pinning region is between 2 and 250 nm, inclusive.

19. The magnetic domain information storage device of claim 13, wherein each magnetic domain storage region has a magnetic anisotropic energy density of between $2 \times 10^3$ and $10^7$ $J/m^3$, inclusive.

20. The magnetic domain information storage device of claim 13, wherein each magnetic domain wall pinning region has a magnetic anisotropic energy density of between $10^1$ and $10^3$ $J/m^3$, inclusive.

21. The magnetic domain information storage device of claim 13, wherein the magnetic layer is formed of a material including at least one of Fe, Co and Pt.

22. The magnetic domain information storage device of claim 13, wherein the magnetic layer is formed of at least one of FePt, FePd, CoCr, CoCu, CoPt, CoTb, CoCrPt, CoFeTb, CoFeGd and CoFeNi.

23. The magnetic domain information storage device of claim 13, wherein the plurality of magnetic domain storage regions and the magnetic domain wall pinning regions are arranged alternately in the magnetic layer.

* * * * *